United States Patent [19]

Sharma et al.

[11] Patent Number: 5,021,398
[45] Date of Patent: Jun. 4, 1991

[54] METHOD OF FORMING PATTERNED OXIDE SUPERCONDUCTING FILMS

[75] Inventors: Suniti K. Sharma, Redwood City; Susanna C. Ventura, Mountain View; Subhash C. Narang, Redwood City, all of Calif.

[73] Assignee: AMP Incorporated, Harrisburg, Pa.

[21] Appl. No.: 428,392

[22] Filed: Oct. 26, 1989

[51] Int. Cl.$^5$ .......................... B05D 3/06; B05D 5/12
[52] U.S. Cl. .......................... 505/1; 505/734; 505/725; 427/63; 427/62; 427/53.1; 427/54.1; 427/43.1; 427/226; 427/299; 427/419.2
[58] Field of Search ............... 505/1, 734; 427/62, 427/63, 43.1, 53.1, 54.1, 226, 387, 299, 419.2, 419.5

[56] References Cited

U.S. PATENT DOCUMENTS 4,156,745  5/1979  Hatzakis et al. ............... 427/43
4,414,127 11/1983  Fu ................................. 252/95

FOREIGN PATENT DOCUMENTS 60-173736  1/1986  Japan .

OTHER PUBLICATIONS

Mantese et al., "Selective Laser Pyrolysis of Metalorganics as a Method of Forming Patterned Thin-Film Superconductors", Appl. Phys. Lett. 53(14), Oct. 1988, pp. 1335-1337.
Mantese et al., "Use of Ion Beam to Decompose Metalorganics into Patterned Thin-Film Superconductors", Appl. Phys. Lett. 52(20), May 1988 pp. 1741-1742.
J. G. Bednorz and K. A. Muller (1986), "Possible High T Superconductivity in the Ba-La-Cu-O System,", Z. Phys. B, vol. B64, pp. 189-193.
M. K. Wu, et al. (1987), "Superconductivity at 93K in a New Mixed-Phase Y-Ba-Cu-o Compound System at Ambient Pressure," Physical Review Letters, vol. 58, pp. 908-910.
H. Adachi, et al. (1987), "Preparation and Characterization of Superconducting Y-Ba-Cu-O Thin Films," Japanese Journal of Applied Physics, vol. 26, pp. L709-710.
R. A. Nelser, et al., (1987), "Plasma Sprayed Superconducting Oxides," Materials Science & Engineering, vol. 91, pp. L13-L15.
H. Koinuma, et al. (1987), "High $T_c$ Superconductivity in Screen Printed Yb-Ba-Cu-O Films," Japanese Journal of Applied Physics, vol. 26, pp. L761-L762.
P. Chaudhari et al. (1987), "Critical-Current Measurements in Epitaxial Films of $YBa_2Cu_3O_{7-x}$ Compound," Physical Review Letters, vol. 58, #25, pp. 2684-2686.
D. Dijkkamp et al. (1987), "Preparation of Y-Ba-Cu Oxide Superconductor Thin Films Using Pulsed Laser Evaporation from High Tc Bulk Material," Applied Physica Letters, vol. 51, pp. 619-621.

(List continued on next page.)

Primary Examiner—Norman Morgenstern
Assistant Examiner—Roy V. King
Attorney, Agent, or Firm—William B. Noll

[57] ABSTRACT

The present invention describes a method to produce a patterned superconducting solid preferably as a thin film. Unsaturated organic acid metal salts of suitable metals are dissolved in an organic solvent, mixed thoroughly and cast as a film on a substrate. The concentration of these organic carboxylate metal salts is adjusted such that a superconducting metal oxide ratio is obtained upon pyrolysis at temperatures up to 1000° C. with subsequent slow cooling. A pattern (mask) is placed over the film and the film is irradiated to polymerize and crosslink the exposed portions. The unpolymerized and uncrosslinked portions are removed usually by using selective solvents or solvent mixtures. The solid remaining is heated in oxygen or air to about 1000° C., which removes the organic portions and leaves metal oxide residue. The metal oxides are then cooled slowly and annealed to produce the patterned metal oxide superconducting materials. The articles of manufacture produced are useful in fabricating devices requiring superconducting thin films in addition to other uses.

23 Claims, 5 Drawing Sheets

OTHER PUBLICATIONS

H. Nasu, et al. (Apr. 1988), "Preparation of BiSrCaCu$_2$O$_x$ Films With T$_c$>77K by Pyrolysis of Organic Acid Salts," Japanese Journal of Applied Physics, vol. 27, #4, pp. L536-L537.

T. Maruyama et al. (1988), "Superconducting Bi-Sr-Ca-Cu-O Thin Films Prepared by Thermal Decomposition of Metallic Complex Salts," Japanese Journal of Applied Physics, vol. 27, #11, pp. L2084-L2087.

K. Hoshino et al. (1988), "Preparation of Superconducting Bi-Sr-Ca-Cu-O Printed Thick Films on MgO Substrate and Ag Metal Tape," Japanese Journal of Applied Physics, vol. 27, #7, pp. L1297-L1299.

S. Kakida et al. (1988), "Preparation of High-Tc Bi-Sr-Ca-Cu-O Films on Metal Substrates by Pyrolysis of 2-Ethylhexanoates," Chemistry Letters (Chemical Society of Japan), pp. 2053-2054.

D. W. Murphy, et al. (1988), "Processing Techniques for the 93K Superconductor Ba$_2$YCU$_3$O$_7$", Science, vol. 241, pp. 922-929.

K. Terashima et al. (1988), "Preparation of Superconducting Y-Ba-Cu-O Films by a Reactive Plasma Evaporation Method," Applied Physics Letters, vol. 52, #15, pp. 274-1276.

H. Nasu et al. (1988), "High T$_c$ Superconducting BA$_2$YCU$_3$O$_X$ Films Prepared by Pyrolysis of Orgnic or Inorganic Acid Salts," Nippon-Seramikkusu-Kyokai-Gakujutsu-Ronbunshi, vol. 96, #6, pp. 710-713.

H. Nasu et al. (1988), "Ba$_2$YCu$_3$O$_x$ Films with T$_c$ (end)>80K Prepared by the Pyrolysis of 2-ethylhexanonates," Journal of Materials Science, vol. 7, pp. 858-860.

J. Mannhart et al. (1988), "Micropatterning of High T$_c$ Films with an Excimer Laser," Applied Physics Letters, vol. 52, #15, pp. 1271-1273.

H. Shimojima et al. (1989), "Preparation of the High-T$_c$ Superconductive Bi-Pb-Sr-Ca-Cu-O Film by Pyrolysis of Organic Acid Salts," Japanese Journal of Applied Physics, vol. 28, #2, pp. L226-L228.

K. Setsune et al. (1988), "Electrical Measurements in High T$_c$ Bi-Sr-Ca-Cu-O Thin Films," Appl. Phys. Lett., vol. 53, pp. 601-602.

I. R. Peterson (1983), "Langmuir-Blodgett Electron-Beam Resists," IEE Proceedings, vol. 130, Pt. 1, No. 5, pp. 252-255.

V. A. Dodonov et al. (1985), "Preparation and Some Reactions of Triphenylbismuth Diacylates," Zhurnal Obshechei Khimii, vol. 55, No. 1, pp. 73-80.

Wilhelm Kuchen et al. (1988), "Metal-Ion-Selective Exchange Resine by Matrix Imprint with Methacrylates," ngew. Chem. Int. Ed. Engl. 27, No. 12, pp. 1695-1697.

E. J. A. Pope et al. (1988), "Organic Polymer Synthesis of Ceramic Semiconductors," 1988 Annual Materials Research Society Fall Meeting, Abstract F9.10, p. 214.

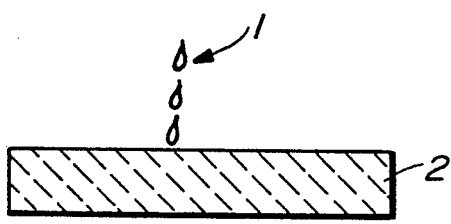
*FIG._IA*
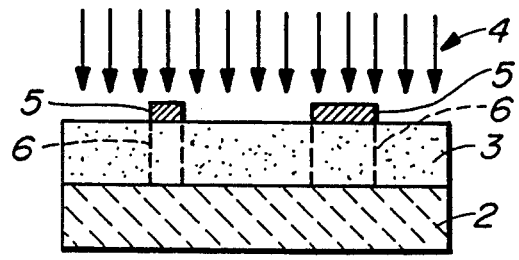
*FIG._IB*
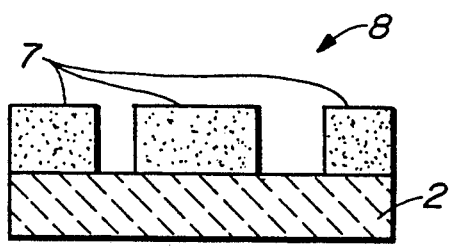
*FIG._ID*
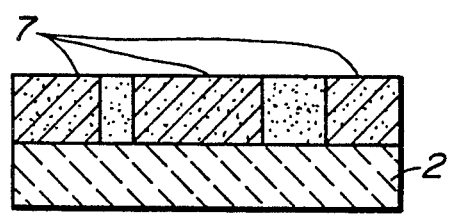
*FIG._IC*
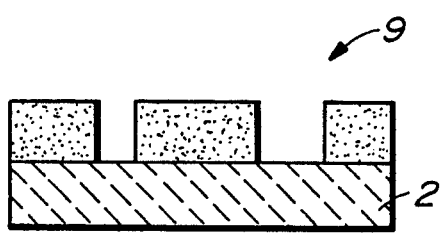
*FIG._IE*
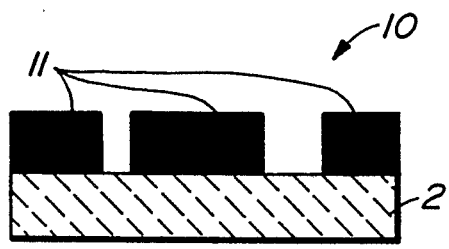
*FIG._IF*

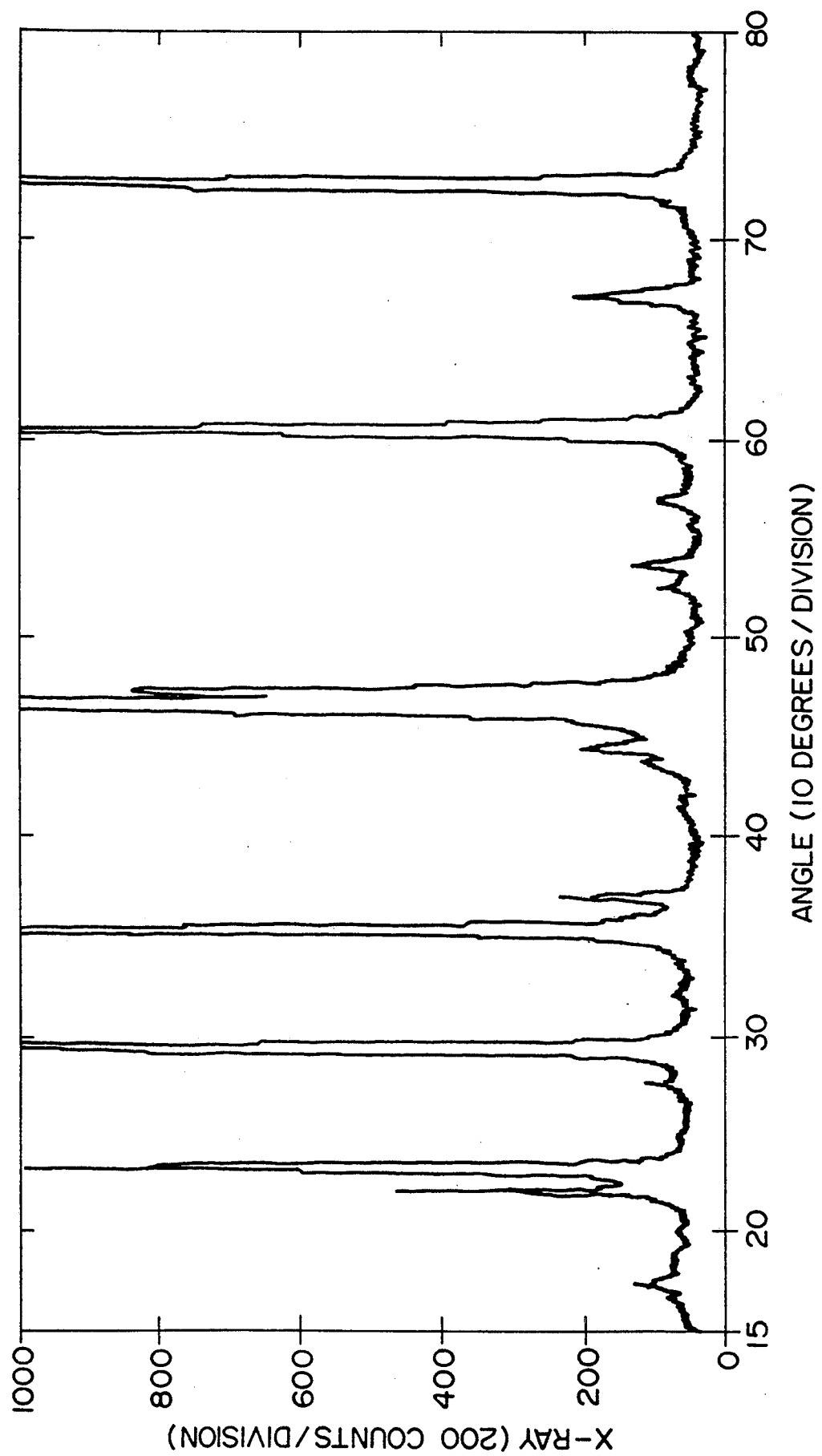
FIG._2

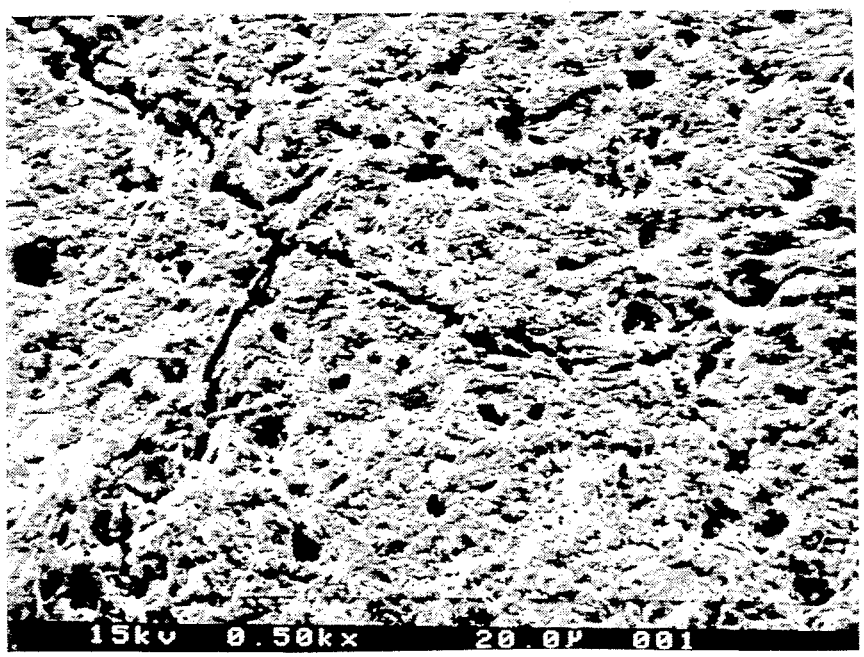
FIG._3

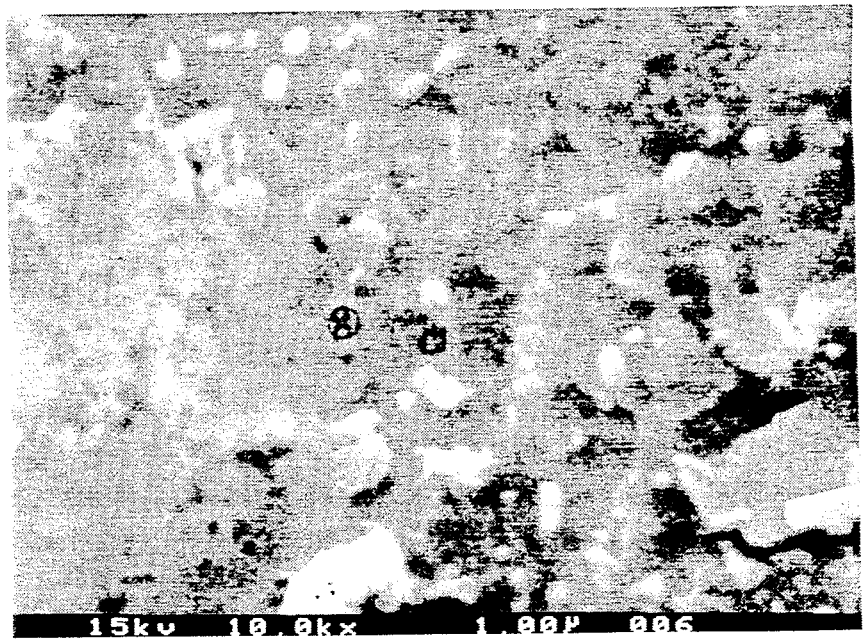
FIG._4

FIG._5

METHOD OF FORMING PATTERNED OXIDE SUPERCONDUCTING FILMS

BACKGROUND OF THE INVENTION

1. Field of the Invention

The present invention relates to a novel method of producing a thin film electrically superconducting solid. Specifically, the method involves casting a thin film of unsaturated organic acid metal salts, covering selected portions using a pattern (mask), crosslinking the exposed portion using electromagnetic radiation, removing the unreacted materials, sintering the material remaining and annealing in oxygen to produce the patterned super-conducting solid metal oxides.

2. Description of Related Art

J. G. Bednorz and K. A. Miller (1986), *Z. phys.*, Vol. B64, p. 189, first disclosed the high critical temperature ($T_c$) electrical superconductor with onset $T_c$ at 30K in a Ba-La-Cu-O system. This report sparked a massive research in all phases of producing and examining superconducting mixed metal oxides. It is now reported that compounds of the Q-Ba-Cu-O system (where Q is yttrium or a rare-earth metal) exhibit superconductivity above liquid nitrogen temperature (77K). See M. K. Wu, et al. (1987), *Physical Review Letters*, Vol. 58, p. 908.

A number of general methods have been described to produce superconducting films of this system. These include, for example, sputtering (H. Adachi, et al. (1987) *Japanese Journal of Applied Physics*, Vol. 26, P. L709), plasma spraying (R. A. Neiser, et al. (1987), *Materials Science and Engineering*, Vol. 91, p. L13, screen printing (H. Koinuma, et al. (1987), *Japanese Journal of Applied Physics*, Vol. 26, p. L761), electron beam (EB) evaporation (R. B. Laibowitz, et al. (1987), *Physical Review Letters*, Vol. 58, #25, p. 2684–2686), and laser evaporation (D. Dijkkamp, et al. (1987), *Applied Physics Letters*, Vol. 51, p. 619).

In these methods, preparations from the vapor phase (except for screen printing) are expected to be available for fabricating high quality high resolution films suitable for electronic devices.

Art of general interest in this area includes the following:

H. Nasu, et al. (April 1988), *Japanese Journal of Applied Physics*, Vol. 27, #4, pp. L536–L537, which discloses the preparation of BiSrCaCu$_2$O$_x$ films having a $T_c$ greater than 77K by pyrolysis of saturated organic acids.

T. Maruyama, et al. (1988), *Japanese Journal of Applied Physics*, Vol. 27, #11, pp. L2084–L2087 discloses superconducting Bi-Sr-Ca-Cu-O thin films prepared by thermal decomposition of metallic complex salts.

K. Hoshino, et al. (1988), *Japanese Journal of Applied Physics*, Vol. 27, #7, pp. L1297–L1299 discloses the preparation of superconducting Bi-Sr-Ca-Cu-O screen printed thick films on magnesium oxide substrate and silver metal tape.

S. Makida, et al. (1988) *Chemistry Letters (Chemical Society of Japan)*, pp. 2053–2054 disclose the preparation of high $T_c$ Bi-Sr-Ca-Cu-O films on metal substrates by pyrolysis of saturated 2-ethyl hexanoates.

D. W. Murphy, et al. (1988), *Science*, Vol. 241, p. 922–929 discloses a number of processing techniques for the high $T_c$ 93K superconducting material Ba$_2$YCu$_3$O$_7$.

K. Terashima, et al. (1988) *Applied Physics Letters*, Vol. 52, #15, pp. 1274–1276 discloses the preparation of superconducting Y-Ba-Cu-O films by a reactive plasma evaporation method.

H. Nasu, et al. (1988), *Nippon-Seramikkusu-Kyokai-Gakujutsu-Ronbunshi*, Vol. 96, #6, pp. 710–713, discloses high $T_c$ superconducting Ba$_2$YCu$_3$O$_x$ films prepared by pyrolysis of saturated organic or inorganic acid salts.

H. Nasu, et al. (1987), *Chemistry Letters* (Chemical Society of Japan), pp. 2403–2404 which discloses superconducting Y-Ba-Cu-O films having a $T_c$ greater than 70K prepared by the thermal decomposition technique of Y-, Ba-, and Cu-2-ethylhexanoates.

H. Nasu, et al. (1988), *Journal of Materials Science*, Vol. 7, pp. 858–860, discloses Ba$_2$YCu$_3$O$_x$ films with a $T_c$ (end) greater than 80K prepared by the pyrolysis of saturated 2-ethylhexanoates.

J. Mannhart, et al. (1988), *Applied Physics Letters*, Vol. 52, #15, pp. 1271–1273 discloses a material for micropatterning of high $T_c$ films with a excimer laser.

H. Shimojima, et al. (1989), *Japanese Journal of Applied Physics*, Vol. 28, #2, pp. L226–L228, discloses the preparation of high $T_c$ superconducting Bi-Pb-Sr-Ca-Cu-O film by pyrolysis of saturated organic acid salts.

E. J. A. Pope, et al., 1988 Annual Materials Research Society Fall Meeting, p. 214, briefly mentions the synthesis of organometallic methacrylate polymers, and their pyrolysis to form superconducting oxide coatings. This abstract does not describe experimental details or patterned superconducting films.

All references, patents, standards, etc. cited in this application are specifically incorporated by reference in their entirety.

None of the available art teaches or suggests the use of an unsaturated organic acid metal salt solution which is configured or cast as a film, then covering portions of the film with a pattern, irradiating the film to polymerize and crosslink the exposed portions, removing the unpolymerized portions, heating the remaining pattern of organic metal salts to about 900° C., then producing the superconducting oxide followed by slow cooling and annealing. The present invention provides such a method to produce patterned superconducting thin film.

SUMMARY OF THE INVENTION

In one aspect, the present invention relates to a process to produce a high $T_c$ electrically superconducting article having a pattern, which method comprises:

(A) combining
  (i) at least one unsaturated organic acid metal salt of a Group IIA element,
  (ii) at least one unsaturated organic acid metal salt of Group IIIA, IIIB, IVA and VA element, and
  (iii) at least one unsaturated organic acid metal salt selected from Group IB, IIB, VIII or IVB element, optionally in admixture with a crosslinking agent and a polymerization initiator to produce a solution or a suspension in an organic solvent, wherein the ratio of metal atoms in (i), (ii) and (iii) is selected to produce a high $T_c$ electrically superconducting article upon its subsequent high temperature pyrolysis up to 1000° C. in pure oxygen or air atmosphere or a mixture of oxygen with other inert gases;

(B) coating the surface of an article with the solution or suspension of step (A);

(C) covering selected portions of the coated article with a mask pattern;

(D) subjecting the coated surface to electromagnetic radiation effective to polymerize and crosslink the portion of the compounds (i), (ii) or (iii) exposed to the radiation;

(E) removing the unpolymerized and uncrosslinked compounds (i), (ii) or (iii);

(F) calcining the solid residue of step (E) in sufficient oxygen or air at a temperature of between about 700° and 1000° C. for a time effective to form the oxide; and (G) slowly cooling the solid obtained at a temperature of between about 1000° C. and ambient temperature in excess air or oxygen subsequently slowly annealing the mixed metal oxide obtained in flowing oxygen or air by slowly cooling from about 500° C. to ambient temperature.

In another aspect, the invention includes in step A the unsaturated organic acid metal salt has at least one C=C and the process further includes at least one crosslinking compound and a polymerization initiator (catalyst).

In another aspect, the invention includes in step (B) the surface of the article to be coated is precoated with a silanizing agent to improve adhesion of the coating.

In another aspect, in step A the unsaturated organic metal acid salt has one or more -C=C- bonds or two or more conjugated -C≡-C- bonds.

In yet another aspect, the present invention includes at least one unsaturated organic acid group for each metal salt is independently selected from organic -C≡C-C≡C-containing organic acids or from:

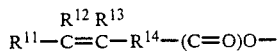

where $R^{11}$ and $R^{12}$ in each group is independently selected from hydrogen, alkyl, aryl, alkenyl or dialkenyl each group independently having from 1 to 10 carbon atoms, or substituted alkyl, aryl, alkenyl or dialkenyl each group independently having from 1 to 10 carbon atoms;

$R^{13}$ in each group is independently selected from hydrogen or alkyl having from 1 to 6 carbon atoms; and $R^{14}$ in each group independently selected from a direct bond (-), or -(CH$_2$)$_n$- where n is an integer from 1 to 10.

In yet another aspect in step A, the Group IIIA, IIIB, IVA and VA elements are each independently selected from bismuth, thallium, lanthanum, lead, yttrium, praseodymium, samarium, europium, gadolinium, dysprosium, holmium, erbium or mixtures thereof, the Group IIA elements are each independently selected from barium, strontium, calcium or mixtures thereof, and the Group IB, IIB, IVB or VIII elements are independently selected from platinum, copper, silver, tin or mixtures thereof.

In another aspect of the present invention relates to a method of manufacturing a high $T_c$ electrically superconducting article of a specific pattern, which method comprises:

(a) independently selecting and combining in an organic solvent at least three carboxylic acid metal compounds of the structure:

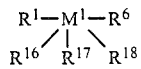 (I)

 (II)

 (III)

 (IV)

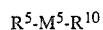 (V)

 (VI)

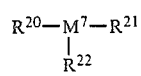 (VII)

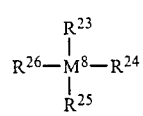 (VIII)

wherein $R^1$, $R^2$, $R^3$, $R^4$ and $R^5$ are each independently selected from:

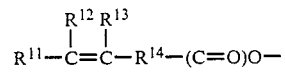

where $R^{11}$ and $R^{12}$ in each of $R^1$ to $R^5$ is independently selected from hydrogen, alkyl, aryl, alkenyl or dialkenyl each group independently having from 1 to 10 carbon atoms, or substituted alkyl, aryl, alkenyl or dialkenyl each group independently having from 1 to 10 carbon atoms;

$R^{13}$ in each of $R^1$ to $R^5$ is independently selected from hydrogen or alkyl having from 1 to 6 carbon atoms; and $R^{14}$ in each of $R^1$ to $R^5$ is independently selected from a direct bond (-), or -(CH$_2$)n- where n is an integer from 1 to 10;

$R^6$, $R^7$, $R^8$, $R^9$ and $R^{10}$ are each independently selected from $R^1$ or -(C=O) $R^{15}$ wherein is alkyl having from 1 to 20 carbon atoms;

$R^{16}$, $R^{17}$ and $R^{18}$ are present in Compound (I) and are selected from phenyl, tolyl or xylyl only when $M^1$ as bismuth is present;

$R^{19}$ is independently selected from $R^1$ to $R^5$ or $R^6$ to $R^{10}$;

$R^{20}$, $R^{21}$ and $R^{22}$ are each independently selected from $R^1$ to $R^5$ or $R^6$ to $R^{10}$;

$R^{23}$, $R^{24}$, $R^{25}$ and $R^{26}$ are each independently selected from $R^1$ to $R^5$ or $R^6$ to $R^{10}$;

$M^1$ and $M^2$ are each independently selected from bismuth, lead, samarium, europium, or mixtures thereof;

$M^3$ and $M^4$ are each independently selected from barium, strontium, calcium or mixtures thereof;

$M^5$ is independently selected from platinum, copper, silver, tin or mixtures thereof;

$M^6$ is selected from thallium, copper or silver;

$M^7$ is selected from thallium, yttrium, bismuth, aluminum, lanthanum, samarium, dysprosium or holmium; or $M^8$ is selected from lead, tin or hafnium, with the proviso that of Compounds (I) to (VIII), the metals $M^1$ to $M^8$ are selected to comprise:
(i) at least one unsaturated organic acid metal salt of Group IIA element,
(ii) at least one unsaturated organic acid metal salt of Group IIIA, IIIB, IVA and VA element, and
(iii) at least one unsaturated organic acid metal salt selected from Group IB, IIB, VIII or IVB element,
wherein the ratio of metal atoms in the combination of Compounds I, II, III, IV, V, VI, VII or VIII is selected which will produce a high $T_c$ electrically superconducting article upon subsequent oxidation;
(b) coating the surface of an article with the solution of step (a), optionally containing a crosslinking agent and initiator;
(c) covering selected portions of the coated article with a mask pattern;
(d) subjecting the coated surface to electromagnetic radiation effective to polymerize and crosslink the portion of the compounds I, II, III, IV, V, VI, VII or VIII exposed to the radiation;
(e) removing the unpolymerized and uncrosslinked compounds I, II, III, IV, V, VI, VII or VIII,
(f) calcining the solid residue of step (e) in sufficient oxygen or air at a temperature of between 700° and 1000° C. for a time effective to form the oxide; and
(g) slowly cooling the solid obtained at a temperature of between about 1000° C. and ambient temperature in excess air or oxygen concurrently slowly annealing the mixed metal oxide obtained in flowing oxygen or air by slowly cooling from about 500° C. to 200° C.

In a related aspect, the surface of the article is precoated with a silane coupling agent or a silanizing agent or a non-metallic surfactant to improve adhesion and uniformity of the film.

BRIEF DESCRIPTION OF THE FIGURES

FIGS. 1A to 1F show in schematic cross-section the dipping photopatterning-pyrolysis (DPP) process.

FIG. 2 is an x-ray diffraction spectrum pattern for BiSrCaCu superconducting oxide on a $SrTiO_3$ single crystal oriented (100).

FIG. 3 is a scanning electron micrograph at 500 magnification of the superconductor Bi-Sr-Ca-Cu-O (2212) on silver buffered quartz.

FIG. 4 is a scanning electron microgrpah at 10,000 magnification of the superconductor Bi-Sr-Ca-Cu-O (2212) on $SrTiO_3$.

FIG. 5 is a scanning electron micrograph at 10,000 magnification of the superconductor Bi-Sr-Ca-Cu-O (2212) after the third coating.

DETAILED DESCRIPTION OF THE INVENTION AND PREFERRED EMBODIMENTS

Definitions

As used herein:

"Alkenyl" refers to mono unsaturated organic groups having 1 to 10 carbon atoms. The unsaturation can be at any location, and conjugated C=C are preferred.

"Alkyl" refers to alkyl groups having from 1 to 10 carbon atoms.

"Aryl" refers to phenyl, naphthyl and the like.

"Dialkenyl" refers to di- or tri-unsaturated organic groups having 1 to 10 carbon atoms. The unsaturated groups can be at any location conjugated C=C bonds are preferred.

"Group IIA elements" refer to magnesium, calcium, strontium and barium or mixtures thereof. Barium and strontium are preferred.

"Group IIIB elements" refer to scandium, yttrium or any of the lanthanide elements having an atomic number of 57 to 71. Yttrium and lanthanides from 57 to 71 are preferred.

"Group VA elements" refer to nitrogen, phosphorus, arsenic, antimony, or bismuth. Bismuth is preferred.

"Group IB elements" refer to copper, silver or gold. Copper is preferred.

"Group IIB elements" refer to zinc, cadmium or mercury. Zinc or cadmium are preferred.

"Group IIIA elements" refer to boron, aluminum, gallium, indium or thallium. Thallium is preferred.

"Group IVA elements" refer to silicon, germanium, tin or lead. Lead is preferred.

"Group VIII elements" refer to iron, cobalt, nickel,

"Group IVB elements" refer to titanium, zirconium or hafnium. Titanium or hafnium are preferred.

"High $T_c$" refers to temperatures above 4° K., preferably at least 30K. More preferably, the temperature is at or above liquid nitrogen temperatures of 77K.

"Non-metallic surfactant" refers to a reagent used to improve film quality but leaves no residue under conditions of pyrolysis.

"Optionally" means that a group may or may not be present or that a particular step may or may not be performed within the present invention.

"Organic -C=C-C-=C- acids" refers to those organic acids or -(C=O)-O- aliphatic compounds (metal salts) having from 5 to 24 carbon atoms. Preferred conjugated dialkyne compounds are those having the structure:

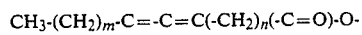

wherein m is an integer between 1 and 10, and n is an integer between 1 and 8.

"Silane coupling agent" refers to a silicon compound with at least one polymerizable group.

"Silanizing agent" refers to a silicon containing compound used to alter the nature of the surface of a substrate regarding the surface interaction with liquids.

"Substituted" refers to substitution for hydrogen, in alkyl, alkenyl or alkynyl groups by alkyl groups or halogen groups. Alkyl groups having 1 to 4 carbon atoms are preferred.

The present invention describes a novel process and patterned product thereof.

High temperature ($T_c$) superconductors are needed to be processed as their thick and thin films, bulk ceramics and wire, tapes or cables. As reported above, the process using saturated organic metal carboxylates has some difficulties. In this invention solubility of the metal carboxylate salts in organic solvents or mixtures of solvents is an important parameter to be overcome.

SELECTION AND PREPARATION OF THE METAL CARBOXLATE COMPOUNDS

The Cu(II), Bi(III) and Ca(II) 2-allylhexanoates were prepared by reacting corresponding metal acetates in the presence of a slight excess of 2-allylhexanoic acid. The equilibrium is forced towards the formation of the metallo-2-allylhexanoates by distilling off the acetic acid formed:

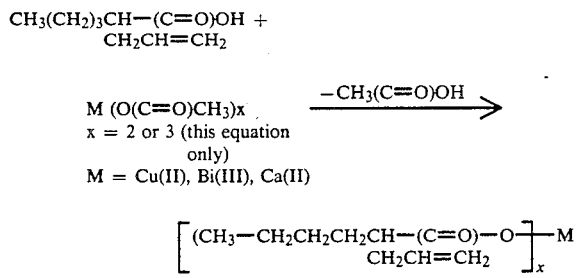

$$CH_3(CH_2)_3CH-(C=O)OH + CH_2CH=CH_2$$

$$M(O(C=O)CH_3)_x \xrightarrow{-CH_3(C=O)OH}$$
x = 2 or 3 (this equation only)
M = Cu(II), Bi(III), Ca(II)

$$\left[ (CH_3-CH_2CH_2CH_2CH-(C=O)-O-)_{} \atop CH_2CH=CH_2 \right]_x M$$

The short unsaturated aliphatic chain appears to improve the solubility of the metal carboxylate in organic solvents or mixtures thereof.

The 2-allylhexanoic acid was prepared by a two-step reaction of n-hexanoic acid with two equivalents of lithium diisopropylamide (LDA) in tetrahydrofuran treatment with hexamethyl phosphoramide (HMPA). In the second step, this reaction product is treated with one equivalent of allyl bromide.

Strontium 2-allylhexanoate was prepared by a different synthetic route by reacting 2-allylhexanoic acid with strontium isopropoxide. The reaction was forced to completion by removal of the isopropanol formed. The barium 2-allylhexanoate can be prepared by the same method.

The solubility of the produced metallo 2-allylhexanoates was tested in a number of organic solvents and solvent mixtures. Two solvent mixtures dimethyl-sulfoxide/tetramethyl urea and pyridine/tetramethyl urea were preferred. The metal 2-allylhexanoates were combined in the proportions needed to satisfy the metal stoichio-metry of a known superconducting compound $Bi_2Sr_{2.2}Ca_{0.8}Cu_2O_8$.

Additional suitable unsaturated organic acids include, for example, oleic acid (Z-9-octadecenoic acid), linoleic acid (Z,Z-9,12-octadecadienoic acid), or linolenic acid (9,12,15-octadecatrienoic acid).

The organic solvents used to produce the solutions needed to form the films of the present invention are important considerations. For instance, $C_3$ to $C_9$ compounds using the same unsaturated carboxylic acid, e.g. di- or tri-methacrylate metal compounds, often have sparing or limited solubility in ethers, alcohols, ketones or nitriles. The dimethacrylate metal salts described herein are soluble at ambient conditions in polar organic, usually amine solvents, such as pyridine, quinoline, alpha-, beta-, or gamma-picoline, and other polar solvents such as dimethyl formamide, dimethylacetamide, hexamethyl-phosphoramide, N-methyl pyrrolidone tetramethyl urea, dimethylsulfoxide or mixtures thereof. Pyridine as a single solvent is preferred. Dimethyl sulfoxide/pyridine (all ratios) or pyridine/tetramethylurea (all ratios) are preferred as solvent combinations Concentrations up to 10-15% by weight of the total weight of solute (organic metal compound) and the solvent (or solvent mixture) are produced. Sonication is preferred to facilitate dissolution. Once the metal carboxylates are dissolved in an amine solvent up to 10% by weight of another solvent can be added without precipitation of the metal compounds. Secondary or tertiary amines having from 3 to 12 carbon atoms, alcohols having from 1 to 5 carbon atoms, ketones having from 3 to 7 carbon atoms, acetonitrile or mixtures of these having lower molecular weight organic solvents to the polar solvent without the solute precipitating from the solution. Useful lower boiling solvents include, for example, diethyl ether, dibutyl ether, dioxane, tetrahydrofuran, diethyl-amine, triethylamine, piperidine, tripropylamine, dibutylamine, tributylamine, acetone, methylethylketone, diethylketone, ethanol, propanol, butanol, pentanol or mixtures thereof. A problem with using the highly polar organic solvents is that they also are fairly high boiling liquids. Therefore, to remove these organic liquids from the polymerized/crosslinked material using moderate heat and high vacuum prior to pyrolysis is often difficult and time consuming. Lower boiling solvents are preferred.

Unsaturated metal acid salts where all acid groups are the same having from 10 to 20 carbon atoms, e.g. the di-, tri- or tetra-oleates, are more soluble in organic solvents or mixtures thereof. The metal salts of the present invention are generally more soluble at ambient conditions in very polar, usually nitrogen-containing solvents such as pyridine, quinoline, alpha-, beta-, or gamma-picoline, dimethylformamide, dimethylacetamide, tetramethylurea or mixtures thereof. Secondary and tertiary aliphatic amines having from 3 to 12 carbon atoms, N-methylpyrrolidone and the like are also useful. Usually these higher chain metal solutes are soluble in about 20 to 40, and often up to about 50, percent by weight of the total solute and solvent. Pyridine is preferred as a single solvent. Again, up to about 10 percent by weight of the total of solute and solvent can be ethers having 4 to 10 carbon atoms, alcohols having 1 to 5 carbon atoms, ketones having 3 to 7 carbon atoms, acetonitrile and the like. As described above, the high boiling solvents are difficult to remove prior to the pyrolysis step. Pyridine/dimethyl-sulfoxide (all ratios) are preferred as a solvent mixture.

A preferred class of unsaturated organic acid metal salts are those where two or more of the acids are of different chain lengths, e.g. the oleate/methacrylate metal salts. These "unsymmetrical" organic metal salts are much more soluble than the pure methacrylates in the usual organic solvents. Pyridine, quinoline, alpha-, beta-, or gamma-picoline, dimethyl-formamide, dimethylacetamide, tetramethylurea or mixtures thereof. These "unsymmetrical" metal salts are also soluble in the N-methylpyrrolidone, secondary or tertiary amines having 3 to 12 carbon atoms in up to 50% by weight of solute and solvent. The amine compounds may be mixed with ethers having 4 to 10 carbon atoms, ketones having 3 to 7 carbon atoms, acetonitrile or mixtures of these lower boiling solvents in up to 50 percent by weight of the total of solute and solvent. In selected solvents, such as pyridine, the picolines, quinoline and the like, these unsymmetrical organic acid metal salts are soluble at ambient conditions at up to 50 percent by weight of the total of solute and solvent. By using the lower molecular weight amines and optionally other low molecular weight solvents, their removal using moderate heat and high vacuum prior to the pyrolysis step is less time consuming and difficult.

Preferably, the oleates or methacrylates or mixtures thereof of the metal salts are used. Suspensions or solutions are used. However, when UV light is used, a required feature of the organic metal salts is that they dissolve completely in an organic solvent or mixture of solvents. More preferably, the mixed oleate/methacrylate metal salts are used. These "unsymmetrical" metal salts are found to be much more soluble than pure methacrylates. While not wanting to be bound by theory, it appears that the unsymmetrical organic salts have a higher solubility because of the disruption of the symmetry of the crystal solid.

Attempts to duplicate the procedure described by Pope, et al. were not successful. The metallic methacrylates gelled upon additon of the solvent, and the gel could not be redissolved to form a film.

A mixture of organometallic compounds which produce superconducting metal oxides of the present invention, include, for example, yttrium (III) methacrylate, barium (II) (oleate) methacrylate, copper (II) methacrylate. Another mixture is triphenyl bismuth (V) dimethacrylate, copper (II) dimethacrylate, calcium (II) (oleate) (meth-acrylate), and strontium (II) dimethacrylate.

To be certain that the methacrylates and/or methacrylates/oleates of the metals had the highest purity, some methacrylates were prepared according to the methods described in Examples 11, 12 and 13.

The precursor compounds are individually analyzed for their metal content. The relative ratios of the individual precursor compounds in a mixture are selected to match the desired molar ratio of the metal atoms in the final metal oxide.

It is presently important to analyze each metal organic compound to obtain a more exact amount of the metal present. Often the methacrylates and the metal methacrylates are somewhat impure. The determination of the metal, content (by methods known in the art) makes it possible to combine the organometallic compounds in a stoichiometric ratio so that a superconducting film is obtained as the oxide upon the heating, cooling and annealing as is described herein. It is anticipated that as the starting materials become more commercially available that the exact metal content will not need to be determined for each metal of the organometallic compound of the organic carboxylic acid compounds.

Some ratios are described herein, and other useful ratios of metals are known in the art and can be used herein, e.g. $Bi_2Ca_1Sr_2Cu_2O_8$.

The ratios of metals are important. Therefore, the metal carboxylates need to be weighed with a high degree of accuracy, e.g. 800 mg±0.01 mg.

PREPARING THE ARTICLE SHAPE

Once the metal carboxylate salts are in solution or suspension in the proper metal ratio, the next step is to prepare the article shape. The solution can take any shape or dimension, e.g., film, wire, cable and the like. Referring to FIG. 1A, film shape is generally preferred. The solution is transferred to a surface of substrate 2. A number of coats may be added to increase the thickness of film 3. The coating may be accomplished by dip coating or uniform spinning. An Integrated Technologies, Inc. spin coater (of Acushnet, Massachusetts) can be used at between about 10 and 8,000 revolutions per minute (rpm). Optionally, solvent can be removed to produce a more stable film. Typically a thin layer is between about 0.1 and 1000 microns, preferably between 0.1 and 100 microns, more prefereably between about 0.5 and 1.0 micron. Multiple coatings can produce the desired thickness.

In one embodiment, the surface of the substrate to be coated with the organometallic compounds is treated with a nonmetallic surfactant. This surfactant aids in the adhesion of the film to the substrate. These surfactants are known in the art, such as the commercially available TWEEN ® series (commercially available from Fluka Chemie AG, Buchs, Switzerland), the TRITON ® series (commercially available from Rohm and Haas Company; Fluka Chemie AG; Aldrich Chemical Company, Ltd. (Milwaukee, Wisconsin) or Biochemical Industries, Inc. (Philadelphia, Pennsylvania) Surfynol ® 104E from Air Products and Chemicals, Inc. (New Mitford, CT), tyloxapol or mixtures thereof. SURFYNOL ® 104E surfactant is a mixture of 2,4,7,9-tetramethyl-5-decyne-4, 7-diol and ethylene glycol. Also see U.S. Pat. No. 4,414,127 for additional useful nonmetallic surfactants. The surface may be first treated with the surfactant and optionally then rinsed with water. Surfynol ® 104E is a preferred surfactant.

Concentrations of surfactant of between about 0.1 and 10 percent by weight of the liquid solution are useful, and 5 percent by weight is preferred.

In another embodiment, the nonmetallic surfactant is part of the composition of step (a) as described herein. In this process, the surfactant (TWEEN ®, TRITON ® and the like) is added to the composition of metal unsaturated compounds in between about 0.1 and 10 percent by weight of the total composition including the solvent. Surfynol ® is a preferred surfactant. A concentration of about 5 percent by weight is preferred.

POLYMERIZING AND/OR CROSS LINKING THE MONOMERS

As shown in FIG. 1B, the polymerization/crosslinking can be accomplished using any suitable electromagnetic radiation source, e.g. laser, ultraviolet lamp, X-ray, electron beam, $\gamma$-radiation and the like. Preferably, achromatic light is used. More preferably, ultraviolet (UV) radiation source 4 is used at between about 153 and 500 nm. A high pressure mercury lamp having radition between about 200 and 600 nm, or low pressure mercury vapor lamp (254 nm) is preferred. The time of irradiation is selected to be effective to crosslink or polymerize the unsaturated materials present in the coating. The time for the present invention is between about 0.1 second to 100 minutes, preferably between about 0.1 minute and 50 minutes, more preferably, 0.1 and 10 minutes, especially about 1 minute. When compounds having C=C bonds are present, a crosslinking agent, such as pentaerythritol triacrylate, and an initiator, such as azobisisobutyro-nitrile (AIBN) or IRGACURE ® is present. When compounds having C=C bonds are present, no crosslinking agent or initiator needs to be present. When the entire film s to be polymerized, no mask or pattern is used. Generally a pattern is desired, and a mask 5 is used to protect certain portions of the film from the UV light. As shown in FIG. 1C, these protected portions 6 do not polymerize. The exposed portion 7 does polymerize and/or cross-link.

REMOVAL OF UNPOLYMERIZED MONOMERS

In FIG. 1D, the unpolymerized monomers 6 in the film are removed by any usual methods, e.g., evaporation, sublimation, selective dissolution, and the like. Generally, selective dissolution is used with the criteria being that the solvent or solvent mixture be selective for dissolving the monomers while being essentially a nonsolvent for the exposed polymerized material. Generally organic solvents are used for a time effective to remove the unpolymerized materials. These include, for example alkanols, ethers, ketones, esters, amine and their mixtures and the like having from 1 to 10 carbon atoms. Preferred organic solvents alone or as mixtures include, for example, ethanol, n-isopropanol, n-butanol, pentanol, dibutyl ethers (all isomers), acetone, methyl ethyl ketone, 3-heptanone, tri-n-ethylamine, tri-n-butylamine, pyridine or quinoline. The coated irradiated film may be dipped sequentially in different solvents A dipping procedure of first dipping the irradiated polymer in n-butanol followed by dipping in diethyl ether is preferred.

REMOVAL OF THE DISSOLUTION AGENTS

Optionally, the patterned coating 7 and substrate film 8 after removal of the unpolymerized portions is subjected to conditions to remove the solvents (FIG. 1E). These conditions include, for example, elevated temperature, e.g. up to 100° C., reduced pressure to about 0.1 Torr. or a combination of these to produce a drier article 9. It is important in this drying procedure to not physically or chemically disrupt the formed pattern.

PYROLYSIS

The substrate and patterned organic film 9 is then subjected to pyrolysis conditions in the presence of flowing oxygen and/or air at a temperature up to 1000° C. for a time effective to remove all organic material, FIG. 1F. At the same time, the oxides formed are heated at a temperature below the melting point and/or decomposition point of the oxide and also no reaction occurs with the substrate. It was found that solutions containing bisumuth could be patterned and heated up to the 860°–875° C. range, and the resulting solid had good superconducting properties. The time for getting the material up to about 900° to 1000° C. is usually not critical. The solid may be held at this elevated temperature from about 0.1 to 20 hr. The remaining metal oxides 11 in a pattern on substrate 2 are then cooled slowly and annealed to produce the desired superconducting metal oxide film pattern. The annealing and cooling temperature time is important.

The oxygen or air is always at a positive pressure. Preferred is an oxygen flow of 25 ml per minute needed to form the pervoskite superconducting oxide.

In one embodiment the patterned organometallic film 9 is heated in oxygen up to 900° C., and held there for between about 1–5 hr, then cooled slowly to about 500° C. at a rate of about 1° C. per min in an oxygen or air environment. The metal oxide film is then cooled slowly in air or oxygen to ambient temperature The patterned superconducting perovskite structure is obtained. The entire process of coating and pyrolysis can be repeated to obtain thicker film.

In another embodiment, a number of layers of metal oxide films are produced by the steps of dipping or spin coating, mask, irradiation, dissolving unpolymerized organic metal salt, drying and pyrolysis up to about 500° in air or oxygen. After a number of such layers are obtained, the layers are then heated to about 900°, held at 900° for between about 0.5 and 10 hr, and slowly cooled at about 1° C. per minute in air or oxygen to ambient temperature.

The presence of a superconducting phase can be identified by various methods, e.g. by resistance data at cryogenic temperatures, diffraction data, SEM, etc. FIG. 2 is the X-ray diffraction spectrum of a pattern obtained, after pyrolysis, on a $SrTiO_3$ single crystal (oriented 100). The sharp peaks point out to a high degree of crystallinity of the ceramic phase. The spectrum is comparable to the one obtained for thick superconducting films (e.g., see Hoshino, et al. in *Japanese Journal of Applied Physics*, Vol. 27, #7, pp. L1297–L1299 (1988).

Resistivity studies performed on Bi-Sr-Ca-Cu-0 and Y-Ba-Cu-O at cryogenic temperatures of between about 4 and 130K show that the oxide and patterned oxide films have superconducting qualities. In a preferred embodiment, the $T_c$ is about 50K or higher.

FIG. 3 shows the scanning electron micrograph (SEM) (magnification 500) of a thin film of the Bi-Sr-Ca-Cu-O superconductor obtained on a silver coated quartz disc. The growth of needle-shaped particles is evident from the SEM photograph.

FIGS. 4 and 5 are the scanning electron microgrpahs of the Bi-Sr-Ca-Cu-O superconductors deposited as thin films on $SrTiO_3$ single crystal (oriented 100) by the above process. The nominal composition was determined by energy dispersive x-ray (EDX). The occurrence of oriented platelets as shown in these figures, is well known for the superconducting ceramics (e.g., K. Setsune, et al. in *Appl. Phys. Lett.*, (1988), Vol. 53, #7; pp. 600–602).

The following is the list of superconducting ceramic compositions produced by the process of the present invention. The list is not to be considered limiting in any way:

$YBa_2Cu_3O_7$;

$Bi_2Sr_2CaCu_2O_8$;

$Tl_2Ba_2Ca_{p-1}Cu_pO_{4+2p}$ (where p=2,3), $(La_{1-q}M_q)_2CuO_{4-r}$ (where M=Ba, Sr and Ca; and $0 \leq q < 0.2$) and $r < 0.1$; $ABa_2Cu_3O_{7-s}$ (where A=rare earth element, $s < 0.45$);

$BiAl_{1-t}CaSrCuO_{7-s}$;

$Bi_2Al_{1-t}(Ca_{1-u}Sr_u)Cu_2O_{7-s}$;

$Bi_2Al_{1-t}(Ca_{1-u}Sr_u)_2Cu_2O_{7-s}$;

$Bi_2Al_{1-t}(Ca_{1-u}Sr_u)_2Cu_2O_{8-s}$ (where $0 \leq t \leq 0.3$ and $0.4 \leq u \leq 0.95$;

$Pb_2Sr_2ACu_3O_8$ where A=lanthanide;

$Tl_1Ca_{n-1}Ba_2Cu_nO_{2(n=3)}$ (n=1,2,3)

$Bi_2Sr_2Cu_2O_{7-s}$;

$Ba_2YCu_3O_q$;

$Bi_2Sr_2CaCu_2O_q$;

$Tl_2Ba_2Ca_{w-1}Cu_wO_{5+2w-1+x}$ (where w=1,2,3 and x is between 0 and 20);

See R. B. King (1988), Chapter 5 (incl. p. 59) in American Chemical Society Symposium Series 377, *Chemistry of High Temperature Superconductors*, D. L. Nelson et al. (ed.) 2nd, 195th Annual ACS Meeting, Los Angeles, California (Sept. 25–30, 1988);

$Bi_2Sr_2Ca_{w-1}Cu_wO_{5+2w-1-q}$; or $Tl_2Ca_2Ba_2Cu_3O_{10}$.

Preparation of Bi-Sr-Ca-Cu-O as perovskite superconducting film—Concentrated solutions of bismuth, copper, calcium, and strontium oleates, all together, were prepared in toluene. The good solubility of metal oleates was useful for investigating their possible use, both as precursors for the fabrication of thin superconducting films, and for photopatterning.

Alternatively, a mixed solution of metal oleates and metal 2-ethyl-hexanoates was used in the preparation of superconducting films. Calcium and strontium oleates were synthesized by reacting respectively calcium methoxide and strontium isopropoxide with a 10% molar excess of oleic acid in anhydrous tetrahydrofuran at room temperature overnight (about 20 hr). The metal carboxylates were isolated by evaporation of the solvent, and thoroughly dried under vacuum (0.1 mm Hg) at room temperature. The metal content was analytically determined for both the synthesized calcium and strontium oleates, and the commercial copper and bismuth 2-ethylhexanoates. 2-Ethylhexanoate metal salts are not provided by Strem Chemicals in the pure solid state, but as liquids, most likely due to the presence of an excess of 2-ethylhexanoic acid. Bismuth 2-ethylhexanoate, calcium oleate, strontium oleate and copper 2-ethylhexanoate were mixed in the metal molar ratio required for the eventual preparation of the 2122 superconducting ceramic. The total concentration of metal carboxylates in toluene was 36.7%. A mixture of 2-ethylhexanoates and oleates, was used instead of using just metal oleates, in order to reduce the overall carbon content compared to that of the metal, and therefore reducing the possibility of undesirable shrinkage of the ceramic film after pyrolysis and annealing. The same metallorganic solution was used in the preparation of films on silver buffered quartz substrates and single crystal [100] $SrTiO_3$ substrates.

Fabrication of Bi-Ca-Sr-Cu-O ceramic films on silver buffered quartz discs--Silver is chemically compatible with the superconducting ceramics. The silver buffered quartz discs are easily obtainable by metal vapor deposition. The fabrication of superconducting films on metal surfaces is also technologically significant in view of practical applications. Films were prepared both by spin coating and by dripping the solution on silver buffered coated substrates. After each coating the substrates were directly introduced into the furnace at 750° C. and kept for about 30 minutes under oxygen. Five consecutive layers were spin coated, and six consecutive ones were drip coated on silver buffered quartz substrates. The ceramic films were finally annealed at 850° C. for 15 hours under oxygen. The films were slowly cooled to ambient temperature in twelve hours under argon. Gray hard ceramic films were obtained with electrical resistance below 3Ω. The surface of the drip coated film was studied by SEM analysis, which shows a few small cracks. The SEM shows the needle-like crystal-line morphology of the film.

Fabrication of Bi-Ca-Sr-Cu-O ceramic films on $SrTiO_3$ discs—Single crystal $SrTiO_3$ (orientation 100) is largely recognized to be a substrate suitable for the fabrication of superconducting films. The tetragonal crystalline structure acts as a template for the growth of the pseudo-tetragonal layered crystalline structure of the superconducting ceramics. The metallorganic solution was drip coated on a polished $SrTiO_3$ disc 20 mm in diameter and 0.5 mm thick. Five consecutive coatings were applied to the substrate. Each layer was pyrolyzed under oxygen by introducing the substrate into the furnace at 50° C., followed by heating at 200° C./hour to 850° C. for about 30 minutes. After five coatings the film was annealed at 850° C. for six hours under oxygen, followed by slow cooling (about 1° C./min) in oxygen to room temperature in twelve hours. A black ceramic film was obtained which by SEM analysis showed the platelet-like crystalline structure of the ceramic film.

Metal oleates have good solubility and spread nicely on substrates indicating good film forming properties, pyrolyze to give ceramic films with superconducting characteristics. However, the photopolymerization of metal oleates is slow.

In order to overcome the sluggish photoreactivity of oleates, but still maintaining their desirable solubility and film forming properties, the metal mixed oleate/methacrylate, where the methacrylic moiety is expected to provide efficient radical photopolymerization were prepared. Copper, strontium and calcium oleate/methacrylates were prepared by reacting the corresponding metal alkoxides (methoxide or isopropoxide) with equivalent amounts of oleic and methacrylic acid in anhydrous tetrahydrofuran. Triphenyl bismuth (V) dimethacrylate was synthesized by the reaction of triphenylbismuth (III) with methacrylic acid, in the presence of tert-butyl hydro-peroxide in tetrahydrofuran. In order to verify their properties, copper, calcium and strontium methacrylates analogously to the mixed methacrylate/oleate were prepared. Both metal mixed oleate/methacrylate and metal dimeth-acrylate have good solubilities. Metal dimethacrylates have good film forming properties on substrates like silver or $SiTiO_3$. If equally soluble, metal dimethacrylates are preferable over metal oleate/methacrylates for dipping-pyrolysis-patterning since they have reduced carbon content, and therefore they are less susceptible to shrinkage upon pyrolysis. On the basis of these considerations, copper dimethacrylate, strontium dimethacrylate, calcium oleate/methacrylate and triphenylbismuth (V) dimethacrylate were dissolved in 20% overall concentration in pyridine. Since calcium dimethacrylate is sparingly soluble in pyridine, calcium oleate/methacrylate is preferred, while triphenyl bismuth (V) dimethacrylate was used for its good solubility and for its ease of preparation. The relative molar ratio of the metals in one composition was Bi:Sr:Ca:Cu (2:2:1:2).

IRGACURE 651 (Trademarked composition of CIBA-GEIGY, Hawthorne, New York 10532) as photoinitiator, and pentaerythritol triacrylate as a crosslinking agent, were added to the solution of metallorganic precursors. IRGACURE is an δ-hydroxy-δ-δ-dialkylacetophenone. Other photo-initiators include 4,4'-azobisisobutyrylnitrile, AIBN; δ, δ-dimethloxy-δ-phenylacetophenone, DMPA; or -δ-dialkoxy-acetophenone, DEAP. Additional UV curing agents are described in *UV Curing Science and Technology* (1985), Vol. II, S. P. Pappas, ed., Technical Marketing Corporation, Norwalk, CT 0685, pp. 1–25. IRGACURE is an efficient benzilketal photoinitiator, active at about 300 nm, while the trifunctional pentaerythritol triacrylate is expected to be effective in the fabrication of metal methacrylates polymer network.

Useful crosslinking agents are the di-, tri- or tetraacrylates of polyalcohols, and include for example trimethylolpropane triacrylate or butanediol diacrylate. The relative concentration of crosslinking agent/initiator was held constant, while their amount versus the overall metal carboxylates concentration (with the exception of the Experiments 1 and 2) was varied as reported below in Table 1.

TABLE 1

| Experiment # | Pentaerythritol triacrylate | IRGACURE 651 |
|---|---|---|
| 1 | 135% | 5% |
| 2 | 135% | 1% |
| 3 | 126% | 1.3% |
| 4 | 75% | 0.8% |
| 5 | 50% | 0.5% |
| 6 | 20% | 0.2% |

The solutions of the organometallic compounds were drip coated onto silver buffered quartz substrates, dried under vacuum at room temperature for about thirty minutes, and exposed through a mask to a high pressure mercury lamp. The films were exposed for about twenty or thirty minutes, before developing. After exposure, the films were dipped in pyridine for about twenty or thirty seconds and then in ether, for three or four cycles. Pyridine acted as the developer, by dissolving the unpolymerized unexposed portion of the film, while ether, a non-solvent, acted as the fixer. Experiments were performed using a large amount of crosslinking agent to assure an efficient tridimensional network, capable of preventing any possible metal leaching in the development process. It was however clear that IRGACURE could not be used in large amounts. In Experiment 1, (Table 1), in which 5% of the IRGACURE photoinitiator was used, the polymerized portion appeared to have scarce adhesion to substrate and had some granularity. By reducing the IRGACURE concentration, as in the Experiment 2, an adherent polymer film was obtained. Using a large amount of photoinitiator appears to quench the radical polymer chains growth and thus favoring a termination step. The polymer film formed was quite thick and colored, showing metal content. A clean pattern boundary was detectable by examination under the optical microscope. The polymer film quality was then monitored while studying the effect of reducing the amount of crosslinking agent, holding constant the relative amount of photoinitiator. The developed films were homogeneous and adhesive to the substrate up to 50% of the crosslinking agent and 0.5% of photoinitiator (Experiment 5). By further reducing the amount of IRGACURE, as in Experiment 6, the polymer film started to peel off during the development in pyridine. Thus concentrations of IRGACURE 651 between about 0.5 and 1% are preferred.

In order to confirm that no metal leaching was taking place in developing the pattern, after photoexposure, Experiment 3 was repeated on a $SrTiO_3$ substrate and the patterned, half of the substrate, after developing, was annealed under oxygen at 850° C. for six hours. After slowly cooling down in twelve hours at room temperature, under oxygen, a black ceramic film is obtained which is highly homogeneous and adherent to the substrate. The homogeneity of the film by its examination under the optical microscope indicated no cracks are evident. The resistance of the ceramic pattern at room temperature was comparable to the one obtained in the preparation of superconducting ceramic films on $SrTiO_3$.

In another aspect of the present invention, patterns are obtained using metal salts of organic acids having a conjugated triple bond structure: -C-≡C-C-≡C-. As was found with the -C≡C- organic acids, the metal organic salts of mixed organic acids are preferred because of their high solubility in organic solvents, as compared to those where all organic acid groups are the same organic acid.

In one embodiment, calcium (10, 12-tricosadiynoate) ethoxyacetate was used to replace the organic calcium salt in Example 6. A typical preparation of calcium (tricosadiynoate) (ethoxyacetate) is described in Example 7 below.

When this mixture of organic acid salts is irradiated using a mask, the unpolymerize material dissolved, the solvents removed, and the pattern pyrolyzed as described herein, a superconducting metal oxide pattern is obtained.

The -C≡C- bonds present must be conjugated as this is a topochemical polymerization. Further, a resolution of less than 0.5 microns of the lines in the superconducting pattern is possible using the -C≡C- bond containing organic acid metal salt. See I. R. Peterson, et al. (1983), *IEEE Proceedings,* Vol. 130, Part I, #5, pp. 252-255.

The following Examples are presented for the purposes of description and explanation only. These are not to be construed to be limiting in any manner.

The unsaturated organic acids are obtained from commercial suppliers such as Aldrich Chemical Company, Milwaukee, Wisconsin, Strem Chemical of Newburyport, Massachusetts, or Alfa Corporation, Danvers, Massachusetts. Chemical suppliers are also identified in *Chem Sources U.S.A.,* published annually by Directories Publishing, Inc., Columbia, South Carolina.

The purity of the chemicals used herein should be at least 95%, and 99 to 99.999% or greater is preferred.

EXAMPLE 1

COPPER (II) METHACRYLATE 1.50 Grams (0.009 mol) of copper (II) ethoxide was introduced into a 50 ml. round bottom flask having a magnetic spinning bar, in an argon atmosphere in a dry box. A solution of 1.84 g (0.02 mol) of methacrylic acid, prepared in 20 ml of anhydrous tetrahydrofuran was then added to it. The contents of the flask were agitated overnight (20 hr) by means of a magnetic stirrer at ambient temperature under argon. All volatile matter was then removed in vacuo (about 0.1 mm Hg) for 12 hours. The resulting solid was analyzed for its metal content.

EXAMPLE 2

TRIPHENYL BISMUTH (V) METHACRYLATE

The general method as outlined by V. A. Dodonov, A. V. Gustichin and T. G. Brilkina (Zh. Obsch. Khim 55, 1(73) 1985) was followed for the preparation of this compound. The details of a typical preparation are: Triphenyl bismuthine (4.4 g, 0.01 mol.), methacrylic acid (1.97 g) (0.02 mol), tert-butyl hydroperoxide (1.39 g) were mixed with 20 ml of diethyl ether in a round bottom flask. The contents were stirred overnight (20 hr) at ambient temperature. The volatile matter was then removed in vacuo (0.1 mm Hg) for 5 hr to obtain a solid which was analyzed for its metal content.

In order to promote solubility the salts of some organic mixed acids were prepared. Thus, calcium (oleate) (methacrylate) is preferred over calcium (methacrylate)$_2$.

EXAMPLE 3

CALCIUM (OLEATE) (METHACRYLATE)

1.02 Grams of calcium (II) methoxide (0.01 mol) was weighed in a round bottom flask in a dry box. A mixture of 0.875 g of (0.01 mol) of methacrylic acid and 2.930 g (0.01 mol) of oleic acid was mixed in 19 g of dry tetrahydrofuran. This acid-mixture was introduced into a round bottom flask which was purged with argon. The contents were magnetically stirred overnight (20 hr) at ambient temperature. The volatile matter was then removed in vacuo (0.1 mm Hg) for 10 hours at room temperature. The resulting solid was analyzed for its metal content.

Metal salts of 2-allylhexanoic acid were prepared either by using a metal acetate (Example 4) or by using a metal alkoxide. For the latter case, the general procedure remains the same as outlined in Example 1 above.

EXAMPLE 4

PREPARATION OF COPPER (II)(2-ALLYLHEXANOATE)$_2$ 1.0 Grams (0.0045 mol) of cupric acetate dihydrate was placed in a round bottom flask and 2.37 g of 2 allyl-hexanoic acid (0.015 mol) was added. The reaction mixture was heated for 16 hr in a slow stream of argon (to drive off liberated acetic acid) at 120°±5° C. in an oil bath. Next it was heated at 110° C. in vacuo (0.1 mm) for another 12 hours. The resulting solid was analyzed for its metal content.

PREPARATION OF THE PRECERAMIC METALLORGANIC SOLUTION

A "master solution" was prepared by mixing the following:

Triphenyl bismuth (V) methacrylate=250.88 mg (33.29 weight percent Bi);
Strontium (methacrylate)$_2$=147.89 mg (23.86 weight percent Sr);
Calcium (oleate) (methacrylate)=91.69 mg (8.82 weight percent Ca); and
Copper (methacrylate)$_2$=124.99 mg (20.36 weight percent Cu).

These methacrylates were analyzed for specific metal content because the methacrylate may usually contain the free inorganic acid and/or organic solvents, and the metal atom stoichiometry and ratio are very important to obtain the high T$_c$ superconducting properties.

The relative ratio of metal carboxylates was chosen in order to meet the nominal compositon of the superconducting ceramic: Bi$_2$Sr$_2$CaCu$_2$O$_8$ (2212).

These salts were combined in 2.46 g of dry pyridine, and then sonicated for 2 hours to obtain a clear transparent solution. The overall concentration of metal carboxylates was 20%, w/w.

"Master-solution" (299 mg), pentaerythritol triacrylate=(709 mg, $3.5 \times 10^{-4}$ mol), and (iii) IRGACURE 651 (CIBA Geigy) (30 mg of 2 wt. % solution in pyridine (1 wt % of methacrylates) were mixed to yield a homogeneous solution. The process of patterning now involves the various steps which are followed in the process sequence illustrated in Example 6.

EXAMPLE 5

PROCESS OF PATTERNING (a) Step I: Strontium titanate polished disc, oriented 100, from Atomergic Chemicals Corp, of Plainview, New York, New York was coated with a silanizing agent, hexamethyl-disilazane, then spun at 2000 RPM for 60 sec using a spin-coater, (from Integrated Technologies);

Step 2: The substrate disc was then drip-coated with the solution produced in Example 5. The coated disc was mounted on a spin coater, and spun at 0.5 K RPM for 60 sec at minimum acceleration of about 50 RPM.

Step 3: The coated substrate was next subjected to vacuum drying (about 0.1 mm Hg) at ambient temperature, well protected from light, for 3 hr to remove volatile materials.

Step 4: The solution coated substrate was exposed to ultra-violet radiation from a 100 watt high-pressure mercury lamp for 2 min. While being irradiated with U.V. radiation, the substrate was kept in a quartz-housing and was covered by a mask which had a pattern to be photo-printed on the substrate. The pattern was then developed by removing the unpolymerized material from the substrate from areas which were protected by the mask pattern from U.V. radiation. This removal was carried out by dipping the substrate in diethyl ether (2 to 3 minutes), then dipping sequentially in n-butanol and diethyl ether. The dips in diethyl ether being of shorter duration. Then a final longer dip was given in diethyl ether. All dips were accompanied by mild shaking of the coated substrate. This procedure was selective to dissolve and remove the unpolymerized metal salts while not dissolving the polymerized materials.

Step 5: The substrate was then baked in the vacuum oven at 60°-70° C. for 3 hr to remove most of the volatile materials from the patterned coated substrate.

Step 6 The substrate was subsequently subjected to pyrolysis in an oxygen (or air) positive pressure. The heating and cooling rates for this step were:

| Start (°C.) | Final (°C.) | Heating/Cooling Rate (°C./hr) | Dwell Time |
|---|---|---|---|
| 40 | 860 | 200 | — |
| 860 | 860 | — | 1 hr |
| 860 | 40 | 300 | — |

(b) One layer of the superconducting pattern of mixed metal oxide of Bi-Sr-Ca-Cu-O was established on the substrate of sub-part (a) above. Multiple-coating was carried out by repeating Example 6(a), Steps 2 to 6 above to get a thicker layer of super conducting ceramic making up the pattern. The mask was aligned with the pattern obtained in the first cycle defined by Steps 1 through 6.

(c) Resistivity Measurements: After each cycle (steps 2 through 6) the resistivity of the pattern was checked by a 4-Point Probe of Alessi Corp. of Irvine, California. After three cycles, the pattern exhibited a resistivity of $1.3 \times 10^{-5}$ ohm cm at ambient room temperature.

(d) Similarly, when subparts (a) and (b) above were repeated except that strontium (methacrylate)$_2$ and triphenyl bismuth (V) dimethacrylate were each substituted by a barium (methacrylate)$_2$ and thallium methacrylate respectively, the corresponding superconducting pattern of perovskite metal oxide of Tl-Ba-Ca-Cu-O (2212) are obtained in good yield.

EXAMPLE 7

CALCIUM(TRICOSADIYNOATE)(ETHOXYACETATE)

0.297 Grams of calcium methoxide was placed in a 50 ml round bottom flask and 20 ml of dry ethyl ether was added. 1.12 g of tricosadiynoic acid, freshly crystallized from diethyl ether, and 0.336 g of ethoxyacetic acid were mixed in 5 ml of diethyl ether. This solution of mixed acids was introduced into the well mixed calcium methoxide solution. The solution was stirred at ambient temperature for 10 to 12 hours and then dried in vacuo (0.1 mm Hg) to produce a solid. All operations were carried out with a careful exclusion of moisture.

EXAMPLE 8

COPPER (II) TRICOSADIYNOATE 0.24 Grams of copper (II) ethoxide was placed in 25 ml of dry tetrahydrofuran. A solution of 1.18 g of tricosadiynoic acid, freshly crystallized from diethyl ether, was prepared in 20 ml. of dry tetrahydrofuran. To ensure the absence of any insolubles, this solution was further filtered through a microfilter ($0.2\mu$). The solution of tricosadiynoic acid was then added, with stirring, to the suspension of copper ethoxide in tetrahydrofuran. The system was stirred at room temperature for 12 hr and then dried in vacuo (0.1 mm Hg) for another 12 hours to produce the solid salt.

Once the salts were obtained the following procedure was adopted for making a pattern as detailed in Example 6.

EXAMPLE 9

PATTERNED SUBSTRATE 1.30 Mg of yttrium (III) tricosadiynoate-prepared in manner similar to the corresponding copper (II) salt of Example 8, 172 mg of barium (oleate) (tricosadiynoate) of Example #7 and 286 mg of copper (II) tricosadiynoate were dissolved in 500 mg of pyridine by sonication for about 2 hours. The solution was drip coated on a silver buffered quartz substate. The substrate was dried in vacuo for 2 hours. It was then covered with a mask and exposed to UV radiation by means of a low pressure mercury lamp for 10 minutes. An argon purge was maintained during UV exposure. For development of the pattern, the following procedure was adopted: The substrate was first dipped in pentane for about 10 seconds and then in dibutyl ether for about 20 seconds followed by dipping in diethyl ether for about 30 seconds. All dips were accompanied by mild agitation. A detailed pattern developed on the substrate.

EXAMPLE 10

PATTERNED SUPERCONDUCTOR

The patterned substrate obtained in Example 9 when then heated and annealed similarly as described above in Example 6, steps 5 and 6, a final temperature of 900° C. was maintained for 3 hours. The patterned superconducting oxide is obtained.

Alternatively the metal methacrylates or the metal salts of mixed acids, e.g. methacrylic acid and oleic acid can be prepared from the metal oxide, carbonate or a basic carbonate. The following examples illustrate some typical preparations.

EXAMPLE 11

PREPARATION OF CALCIUM(METHACRYLATE)(OLEATE)

A solution of 3.06 g of oleic acid (0.010 mole) and 1.0 g of methacrylic acid (0.011 mole) was prepared in 10 g of tetrahydrofuran (THF). This was added to 0.561 g of calcium oxide (0.01 mole) in 100 ml round bottomed flask. The system was kept for stirring at room temperature for 4 hrs. A slurry was obtained which is completely miscible with pyridine The slurry was evacuated (0.1 mm) to yield a solid which dissolves in pyridine after sonication for 5 to 6 hrs. For best results, it is preferable to use the slurry for preparing the master solution.

EXAMPLE 12

PREPARATION OF STRONTIUM (II) METHACRYLATE 0.103 Gram ($1 \times 10^{-3}$ mole) of strontium oxide (prepared by the thermal decomposition of strontium (II) nitrate) was taken in a 100 ml round bottom flask. A solution of 0.280 g of methacrylic acid ($3.2 \times 10^{-3}$ mole) in 1.1 g of THF was added to it. The sytem was kept for stirring for 12 hrs. The slurry so obtained is soluble in pyridine on sonication.

A part of the slurry was evacuated for two hours to get a solid that gave a slight suspension in pyridine on sonication. The suspension so obtained can be filtered through a micro filter to get a clear solution.

EXAMPLE 13

PREPARATION OF COPPER (II) METHACRYLATE)

The method of Kuchen et al. (Angew. Chem. Int. Ed. Engl.), Vol. 27, #12, pp. 1695-1697 (1988) was followed with minor variation. For example, 1.01 g ($4.5 \times 10^{-3}$ mole) of basic copper carbonate was taken in a 100 ml round bottom flask. A mixture of 50 ml of THF and 2.4 g (0.028 mole) of methacrylic acid was added to it. The system was sonicated for 8 hrs. 30 Milligrams of pyridine was added to get a deep blue solution. The solution can be used directly to prepare the master solution While only a few embodiments of the invention have been shown and described herein, it will become apparent to those skilled in the art that various modifications and changes can be made in the method to produce thin films of superconducting metal oxides and the films thereof without departing from the spirit and scope of the present invention. All such modifications and changes coming within the scope of the appended claims are intended to be carried out thereby.

We claim:

1. A process to produce a high $T_c$ electrically superconducting article having a pattern, which method comprises:
   (A) combining compounds selected from:
      (i) at least one unsaturated organic acid metal salt of a Group IIA element,
      (ii) at least one unsaturated organic acid metal salt of bismuth or a Group III A, III B, IVA, VA element, and
      (iii) an unsaturated organic acid copper salt, to produce a solution or a suspension in an organic solvent, wherein the ratio of metal atoms in (i), (ii) and (iii) is selected wherein each unsaturated organic acid metal salt above contains at least one C=C bond or two or more C≡C bonds, to produce a high $T_c$ electrically superconducting article upon its subsequent high temperature pyrolysis in an oxygen or air atmosphere;
   (B) coating the surface of an article with the solution of step (A);
   (C) covering selected portions of the coated article with a mask pattern;
   (D) subjecting the coated surface to electromagnetic radiation effective to polymerize and crosslink the portion of the compounds (i), (ii) and (iii) exposed to the radiation;
   (E) removing the unpolymerized and uncrosslinked compounds (i), (ii) and (iii), to produce a solid residue on the coated surface;

(F) calcining the solid residue of step (E) in sufficient oxygen or air at a temperature of between 700° and 900° C. for a time effective to obtain a mixed metal oxide; and (G) slowly cooling the solid residue obtained at a temperature of between about 900° C. and about 500° C. at a rate of between about 1° and 5° C. per minute in excess air or oxygen and subsequently slowly annealing the mixed metal oxide obtained in flowing oxygen or air by slowly cooling from about 500° C. to ambient temperature at a rate of between about 1° and 5° C. per minute.

2. The process of claim 1 wherein in step A the unsaturated organic acid has is at least one C=C and the process further includes at least one crosslinking compound and a polymerization catalyst 3. The process of claim 1 wherein in step (B) the surface of the article is precoated with a silane coupling or silanizing agent to improve adhesion of the coating.

4. The process of claim 1 wherein the at least one unsaturated organic acid group for each element is independently selected from organic -C≡C-C≡C- containing acids or from:

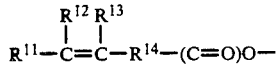

where $R^{11}$ and $R^{12}$ in each group is independently selected from hydrogen, alkyl, aryl, alkenyl or dialkenyl each group independently having from 1 to 10 carbon atoms, or substituted alkyl, aryl, alkenyl or dialkenyl each group independently having from 1 to 10 carbon atoms;

$R^{13}$ in each group is independently selected from hydrogen or alkyl having from 1 to 6 carbon atoms; and $R^{14}$ in each group independently selected from a direct bond (-), or $-(CH_2)_n-$ where n is an integer from 1 to 10.

5. The process of claim 1 wherein
the Group IIIA, IIIB, IVA, VA elements are each independently selected from bismuth, lanthanum, yttrium, praseodymium, lead, thallium, samarium, europium, gadolinium, dysprosium, holmium, erbium or mixtures thereof,
the Group IIA elements are each independently selected from barium, strontium, calcium or mixtures thereof, and
(iii) copper.

6. The process of claim 1 wherein bismuth is present in step (A) having five substituents having at least one unsaturated organic acid and the remaining substituents are selected from phenyl, tolyl, xylyl or naphthyl.

7. The process of claim 6 wherein bismuth is present in step (A) as triphenylbismuth dimethacrylate.

8. The process of claim 4 wherein the at least one organic acid group has two or more conjugated C≡C bonds of the structure
$CH_3-(CH_2)_m-C≡C-C≡C(-CH_2)_n(-C=O)-O-$
wherein m is an integer between 1 and 10, and n is an integer between 1 and 8.

9. The process of claim 1 wherein
in step (A)(i) the Group IIA elements are calcium (oleate)(methacrylate) and strontium (methacrylate)$_2$,
in step (A)(iii) the salt is triphenyl bismuth (V) dimethacrylate,
in step (A) (iii) the salt is copper (II) dimethacrylate, in a metal ratio Bi/Sr/Ca/Cu of about 2 to 2 to 1 to 2, dissolved in pyridine, contacted with pentaerythritol triacrylate and a photoinitiator,
in step (D) subjecting the coating to ultraviolet radiation for a time effective to crosslink the materials exposed,
in step (E) contacting the exposed film with n-butanol and diethylether to remove unpolymerized materials, and
in step (F) heating the crosslinked film to 860° C. at about 200° C. per hr, heating at 860° C. for about 1 hr and cooling the oxide at a rate of about 1° C. per minute to ambient temperature.

10. A process of manufacturing a high $T_c$ electrically superconducting article of a specific pattern, which method comprises:
(a) preparing a solution comprising an organic solvent and at least three carboxylic acid metal compounds selected from the following structures:

 (I)

 (II)

 (III)

 (IV)

 (V)

 (VI)

 (VII)

 (VIII)

wherein $R^1$, $R^2$, $R^3$, $R^4$ and $R^5$ are each independently selected from organic -C≡C-≡C- containing acids or from:

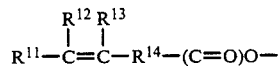

wherein $R^{11}$ and $R^{12}$ in each of $R^1$ to $R^5$ is independently selected from hydrogen, alkyl, aryl, alkenyl or dialkenyl each group independently having from 1 to 10 carbon atoms, or substituted alkyl, aryl, alkenyl or dialkenyl each group independently having from 1 to 10 carbon atoms;

$R^{13}$ in each of $R^1$ to $R^5$ is independently selected from hydrogen or alkyl having from 1 to 6 carbon atoms; and $R^{14}$ in each of $R^1$ to $R^5$ is independently selected from a direct bond (-), or $-(CH_2)_n-$ where n is an integer from 1 to 10;

$R^6$, $R^7$, $R^8$, $R^9$ and $R^{10}$ are each independently selected from $R^1$ or $-(C=O)R^{15}$ wherein $R^{15}$ is alkyl having from 1 to 20 carbon atoms, $R^{16}$, $R^{17}$ and $R^{18}$ are present and are selected from phenyl, tolyl or xylyl only when $M^1$ as bismuth is present, $R^{19}$ is independently selected from $R^1$ to $R^5$ or $R^6$ to $R^{10}$, $R^{20}$, $R<$ and $R^{22}$ are each independently selected from $R^1$ to $R^5$ or $R^6$ to $R^{10}$, $R^{23}$, $R^{24}$, $R^{25}$ and $R^{26}$ are each independently selected from $R^1$ to $R^5$ or $R^6$ to $R^{10}$, $M^1$ and $M^2$ are each independently selected from bismuth, lead, samarium, europium, or mixtures thereof, $M^3$ and $M^4$ are each independently selected from barium, strontium, calcium or mixtures thereof, $M^5$ is copper;

$M^6$ is copper;

$M^7$ is selected from thallium, yttrium, bismuth, aluminum, lanthanum, samarium, dysprosium or holmium, and $M^8$ is selected from lead, tin or hafnium, with the proviso that compounds (I) to (VIII), are selected to comprise:
  (i) at least one unsaturated organic acid metal salt of Group IIA element,
  (ii) at least one unsaturated organic acid metal salt of Group IIIA, IIIB, IVA and VA element, and
  (iii) an unsaturated organic acid copper, wherein the ratio of metal atoms in Compounds I, II, III, IV, V, VI, VII and VIII is selected to produce a high $T_c$ electrically superconducting article upon subsequent oxidation;

(b) coating the surface of an article with the solution of step (a), optionally containing a crosslinking agent and initiator;

(c) covering selected portions of the coated article with a mask pattern;

(d) subjecting the coated surface to electromagnetic radiation effective to polymerize and crosslink the portion of the compounds I, II, III, IV, V, Vi, VII and VII exposed to the radiation;

(e) removing the unpolymerized and uncrosslinked compounds I, II, III, IV, V, VI, VII and VIII, to produce a solid residue on the coated surface, (f) calcining the solid residue of step (e) in sufficient oxygen or air at a temperature of between 700° and 1000° C. for a time effective to obtain a mixed metal oxide; and (g) slowly cooling the solid residue obtained at a temperature of between about 1000° C. and 500° C. at a rate of between about 1° and 5° C. per minute in excess air or oxygen concurrently slowly annealing the mixed metal oxide obtained in flowing oxygen or air by slowly cooling from about 500° C. to 200° C. at a rate of between about 1° and 5° C. per minute.

11. The process of claim 10 wherein in step (b) the surface of the article is precoated with a silanizing agent or a silane coupling agent to improve adhesion of the coating.

12. The process of claim 10 wherein in step (a) the organic solvent is pyridine.

13. The process of claim 10 wherein the surface of the substrate to be coated is first treated with a non-metallic surfactant.

14. The process of claim 11 wherein the composition of step (a) further includes a nonmetallic surfactant.

15. The process of claim 14 wherein the surfactant is independently selected from SURFYNOL® 104E, TRITON® or TWEEN® surfactants.

16. The process of claim 1 wherein the super-conducting oxide formed is independently selected from:

$YBa_2Cu_3O_7$;

$Bi_2Sr_2CaCu_2O_8$;

$Tl_2Ba_2Ca_{p-1}Cu_pO_{4+2p}$ (where p=2,3), $(La_{1-q}M_q)_2CuO_{4-r}$ (where M=Ba, Sr and Ca; and $O \leq q < 0.2$) and $r \leq 0.1$;

$AB_a2Cu_3O_{7-s}$ (where A=rare earth element, s<0.45);

$BiAl_{1-t}CaSrCuO_{7-2}$;

$Bi_2Al_{1-t}(Ca_{1-u}Sr_u)Cu_2O_{7-s}$;

$Bi_2Al_{1-t}(Ca_{1-u}Sr_u)_2Cu_2O_{7-s}$;

$Bi_2Al_{1-t}(Ca_{1-u}Sr_u)_2Cu_2O_{8-s}$ (where $O \leq t \leq 0.3$ and $0.4 \leq u \leq 0.95$);

$Pb_2Sr_2ACu_3O_8$ where A=lanthanide;

$Tl_1Ca_{n-1}Ba_2Cu_nO_{2(n+3)}$ (n=1,2,3);

$Bi_2Sr_2Cu_2O_{7-s}$;

$Ba_2YCu_3O_q$;

$Bi_2Sr_2CaCu_2O_q$;

$Tl_2Ba_2Ca_{w-1}Cu_wO_{5+2w-1+x}$ (where w=1,2,3 and x is between 0 and 20);

$Bi_2Sr_2Ca_{w-1}Cu_wO_{5+2w-1-q}$; or $Tl_2Ca_2Ba_2Cu_3O_{10}$.

17. The process of claim 1 wherein in step A, the metal organic salts have at least one metal compound having different unsaturated organic groups attached, at least one group having from 3 to 9 carbon atoms and at least one having from 10 to 20,carbon atoms.

18. The process of claim 17 wherein at least one group is CH2=C-(CH )(C=O)-O-, and one group on the oleic acid group.

19. The process of claim 10 wherein the superconducting oxide formed is independently selected from:

$YB_a2Cu_3O_7$;

$Bi_2Sr_2CaCu_2O_8$;

$Tl_2Ba_2Ca_{p-1}Cu_pO_{4+2p}$ (where p=2,3);

$(La_{1-q}M_q)_2CuO_{4-r}$ (where M=Ba, Sr and Ca; and $O<q<0.2$) and $r<0.1$; $ABa_2Cu_3O_{7-s}$ (where A=rare earth element, s<0.45);

$BiAl_{1-t}CaSrCuO_{7-s}$;

$Bi_2Al_{1-t}(Ca_{1-u}Sr_u)Cu_2O_{7-s}$;

$Bi_2Al_{1-t}(Ca_{1-u}Sr_u)_2Cu_2O_{7-s}$;

$Bi_2Al_{1-t}(Ca_{1-u}Sr_u)_2Cu_2O_{8-s}$ (where $O<t<0.3$ and $0.4<u<0.95$);

$Pb_2Sr_2ACu_3O_8$ where A=lanthanide;

$Tl_1Ca_{n-1}Ba_2Cu_nO_{2(n+3)}$ (n=1,2,3);

$Bi_2Sr_2Cu_2O_{7-s}$;

$Ba_2YCu_3O_q$;

$Bi_2Sr_2CaCu_2O_q$;

$Tl_2Ba_2Ca_{w-1}Cu_wO_{5+2w-1+x}$ (where w=1,2,3 and x is between 0 and 20);

$Bi_2Sr_2Ca_{w-1}Cu_wO_{5+2w-1-q}$; or $Tl_2Ca_2Ba_2Cu_3O_{10}$.

20. The process of claim 10 wherein in step (a) the organic metal groups have at least one metal compound having different unsaturated groups attached at least one group having from 3 to 9 carbon atoms, and at least one group having from 10 to 20 carbon atoms.

21. The process of claim 20 wherein at least one group is $CH_2=C(CH_3)(C=O)-O-$ and one group is the oleic group.

22. The process of claim 1 wherein in step (A) the metal atoms comprise Bi-Sr-Ca-Cu-O in a ratio of about 2212.

23. The process of claim 22 wherein in step (A) the organic metal compounds comprise triphenyl bismuth (V) dimethacrylate, strontium (II) dimethyacrylate, calcium (II) (oleate) methyacrylate, and copper (II) dimethacryalte.

* * * * *

UNITED STATES PATENT AND TRADEMARK OFFICE
CERTIFICATE OF CORRECTION

PATENT NO. : 5,021,398

DATED : June 4, 1991

INVENTOR(S) : Suniti K. Sharma, Susanna C. Ventura, Subhash C. Narang

It is certified that error appears in the above-identified patent and that said Letters Patent is hereby corrected as shown below:

In claim 2, column 21, line 16, after the word "catalyst" insert --.--.

In claim 8, column 21, line 57, "claim 4" should be --claim 1--.

In claim 10, column 22, line 27, "$R^2M^2R^7$" should be --$R^2 - M^2 - R^7$--.

In claim 10, column 23, line 6, change "R<" to --$R^{21}$--.

In claim 10, column 23, line 38, change "Vi" to --VI--.

In claim 10, column 23, line 48, before "500°C." add --about--.

UNITED STATES PATENT AND TRADEMARK OFFICE
CERTIFICATE OF CORRECTION

PATENT NO. : 5,021,398  Page 2 of 2

DATED : June 4, 1991

INVENTOR(S) : Suniti K. Sharma, Susanna C. Ventura, Subhash C. Narang

It is certified that error appears in the above-identified patent and that said Letters Patent is hereby corrected as shown below:

In claim 16, column 24, line 7, change "$O\leq$" to --$O\leq$--; change "$r\leq$" to --$r\leq$--.

In claim 16, column 24, line 10, change "$O_{7.2}$" to --$O_{7.s}$--.

In claim 16, column 24, line 13, change "(where $0\leq t\leq 0.3$" to --where $0\leq t\leq 0.3$--.

In claim 16, column 24, line 14, change "$0.4\leq u\leq$" to --$0.4\leq u\leq$--.

In claim 18, column 24, line 30, change "(CH )" to --($CH_3$)--.

Signed and Sealed this

Twenty-second Day of December, 1992

*Attest:*

DOUGLAS B. COMER

*Attesting Officer*   *Acting Commissioner of Patents and Trademarks*